US011156644B2

(12) United States Patent
Cochet et al.

(10) Patent No.: US 11,156,644 B2
(45) Date of Patent: Oct. 26, 2021

(54) IN SITU PROBING OF A DISCRETE TIME ANALOG CIRCUIT

(71) Applicant: International Business Machines Corporation, Armonk, NY (US)

(72) Inventors: Martin Cochet, White Plains, NY (US); Troy James Beukema, Briarcliff Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 295 days.

(21) Appl. No.: 16/239,215

(22) Filed: Jan. 3, 2019

(65) Prior Publication Data

US 2020/0217876 A1    Jul. 9, 2020

(51) Int. Cl.

| | |
|---|---|
| *G01R 1/20* | (2006.01) |
| *G01R 19/10* | (2006.01) |
| *G01R 19/00* | (2006.01) |
| *G01R 15/16* | (2006.01) |
| *G01R 21/06* | (2006.01) |
| *G01R 35/00* | (2006.01) |

(52) U.S. Cl.
CPC ............ *G01R 19/10* (2013.01); *G01R 1/203* (2013.01); *G01R 15/16* (2013.01); *G01R 19/0084* (2013.01); *G01R 19/0092* (2013.01); *G01R 21/06* (2013.01); *G01R 35/005* (2013.01); *H01L 2924/00* (2013.01); *H01L 2924/0002* (2013.01)

(58) Field of Classification Search
CPC ............. G01R 19/0092; G01R 1/203; G01R 19/0084; G01R 15/16; G01R 21/06; G01R 35/005; H01L 2924/00; H01L 2924/0002

USPC .................. 324/76.11–76.83, 115, 126, 149
See application file for complete search history.

(56) References Cited

U.S. PATENT DOCUMENTS

| | | | |
|---|---|---|---|
| 8,357,958 B2 | 1/2013 | Cummins | |
| 9,129,779 B2 | 9/2015 | Booth et al. | |
| 2001/0024119 A1 | 9/2001 | Stockford | |
| 2002/0000924 A1* | 1/2002 | Sarraj .................. | G11C 27/026 341/122 |
| 2004/0027174 A1* | 2/2004 | Ballentin ............. | G11C 27/024 327/94 |
| 2006/0220734 A1* | 10/2006 | Koen ........................ | H03F 1/02 330/9 |

(Continued)

FOREIGN PATENT DOCUMENTS

| | | |
|---|---|---|
| CN | 104090222 A | 10/2014 |
| CN | 204255529 U | 4/2015 |

OTHER PUBLICATIONS

Bulzacchelli, et al., A 28-GB/s 4-Tap FFE/15-Tap DFE Serial Link Transceiver in 32-nm SOI CMOS Technology, IEEE Journal of Solid-State Circuits, Dec. 2012, 17 Pages, vol. 47, No. 12.

(Continued)

*Primary Examiner* — Raul J Rios Russo
(74) *Attorney, Agent, or Firm* — Amin, Turocy & Watson, LLP

(57) ABSTRACT

Devices, systems, and methods that can facilitate in situ probing of a discrete time circuit components are provided. According to an embodiment, a device can comprise a hold circuit that can generate a sampled signal at a holding stage. The device can further comprise an in situ probe device that can be coupled to the hold circuit that can measure one or more operating voltage values at the holding stage based on the sampled signal.

20 Claims, 12 Drawing Sheets

(56) References Cited

U.S. PATENT DOCUMENTS

| | | | | |
|---|---|---|---|---|
| 2007/0285296 | A1* | 12/2007 | Bilhan | H03M 1/0629 |
| | | | | 341/155 |
| 2010/0093302 | A1* | 4/2010 | Abe | H04B 1/30 |
| | | | | 455/325 |
| 2010/0321227 | A1* | 12/2010 | Hales | H03M 1/146 |
| | | | | 341/158 |
| 2011/0215831 | A1* | 9/2011 | Holt | H04Q 9/00 |
| | | | | 326/30 |
| 2012/0260743 | A1 | 10/2012 | Hersche et al. | |
| 2015/0170760 | A1* | 6/2015 | Nardi | G11C 27/02 |
| | | | | 327/94 |
| 2017/0162275 | A1* | 6/2017 | Gao | G01R 19/2509 |

OTHER PUBLICATIONS

Agrawal, et al., A 19Gb/s Serial Link Receiver with Both 4-Tap FFE and 5-Tap DFE Functions in 45nm SOI CMOS, International Solid-State Circuits Conference, Feb. 21, 2012, 3 Pages.

Gangasani, et al., A 28.05Gb/s Transceiver using Quarter-Rate Triple-Speculation Hybrid-DFE Receiver with Calibrated Sampling Phases in 32nm CMOS, Symposium on VLSI Circuits Digest of Technical Papers, 2017, 2 Pages.

Thakkar, et al., Design Techniques for a Mixed-Signal I/Q 32-Coefficient Rx-Feedforward Equalizer, 100-Coefficient Decision Feedback Equalizer in an 8 GB/s 60 GHz 65 nm LP CMOS Receiver, IEEE Journal of Solid-State Circuits, Nov. 2014, 20 Pages, vol. 49, No. 11.

Jaussi, et al., 8-GB/s Source-Synchronous I/O Link With Adaptive Receiver Equalization, Offset Cancellation, and Clock De-Skew, IEEE Journal of Solid-State Circuits, Jan. 2005, 9 Pages, vol. 40, No. 1.

Han, et al., A 60Gb/s 173mW Receiver Frontend in 65nm CMOS Technology, Symposium on VLSI Circuits Digest of Technical Papers, 2015, 2 Pages.

* cited by examiner

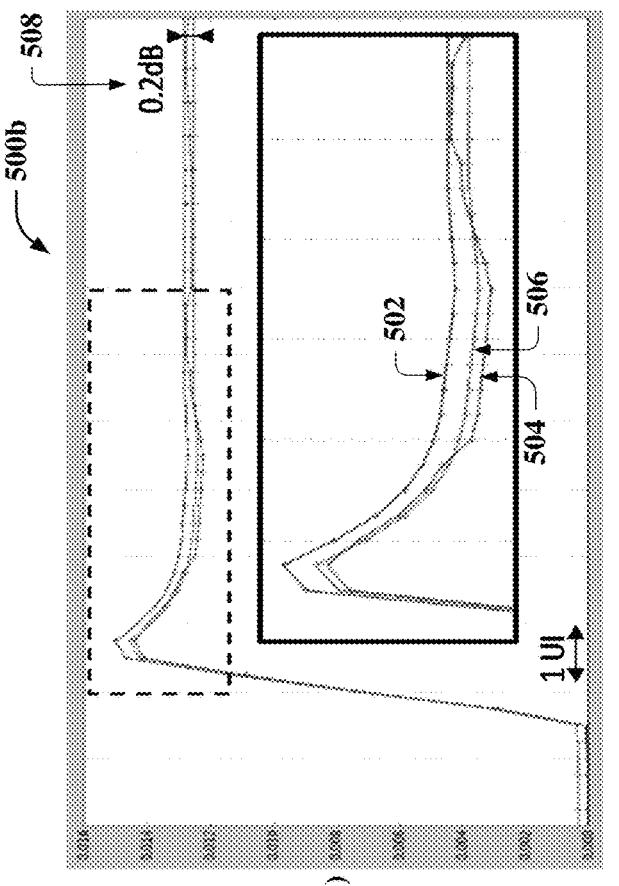
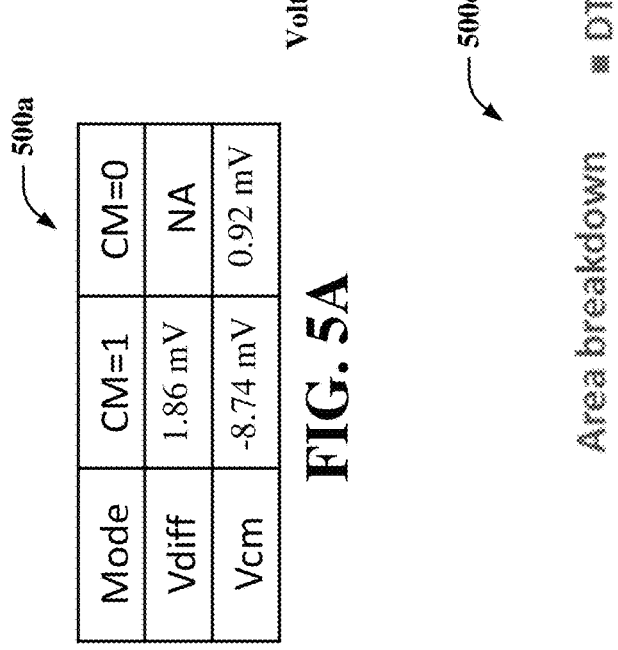
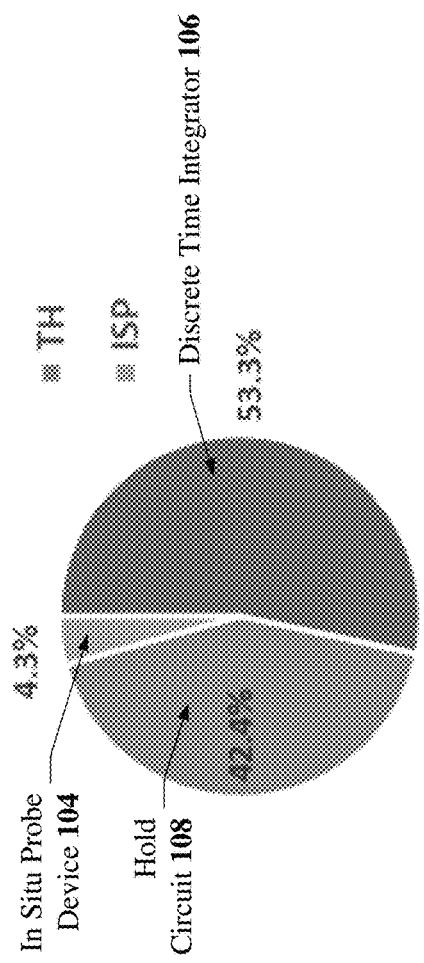
FIG. 5A
FIG. 5B
FIG. 5C

IN SITU PROBING OF A DISCRETE TIME ANALOG CIRCUIT

STATEMENT REGARDING FEDERALLY SPONSORED RESEARCH OR DEVELOPMENT

This invention was made with Government support under Contract No.: HR0011-16-C-0040 awarded by Defense Advanced Research Projects Agency (DARPA). The Government has certain rights in this invention.

BACKGROUND

The subject disclosure relates to discrete time circuits, and more specifically, to in situ probing of a discrete time analog circuit.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, and/or methods that can facilitate in situ probing of a discrete time circuit components are described.

According to an embodiment, a device can comprise a hold circuit that can generate a sampled signal at a holding stage. The device can further comprise an in situ probe device that can be coupled to the hold circuit that can measure one or more operating voltage values at the holding stage based on the sampled signal.

According to another embodiment, a method can comprise coupling an in situ probe device to a hold circuit. The method can further comprise measuring one or more operating voltage values of a sampled signal generated at a holding stage based on the sampled signal.

According to another embodiment, a device can comprise a wireline device that can comprise a discrete time circuit that can generate a sampled signal at a holding stage. The device can further comprise one or more in situ probe devices that can be coupled to the discrete time circuit that can measure one or more operating voltage values at the holding stage based on the sampled signal.

DESCRIPTION OF THE DRAWINGS

FIGS. 5A, 5B, and 5C illustrate example, non-limiting information that can facilitate in situ probing of a discrete time circuit components in accordance with one or more embodiments described herein.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. It is noted that the drawings of the present application are provided for illustrative purposes only.

Figure 1:
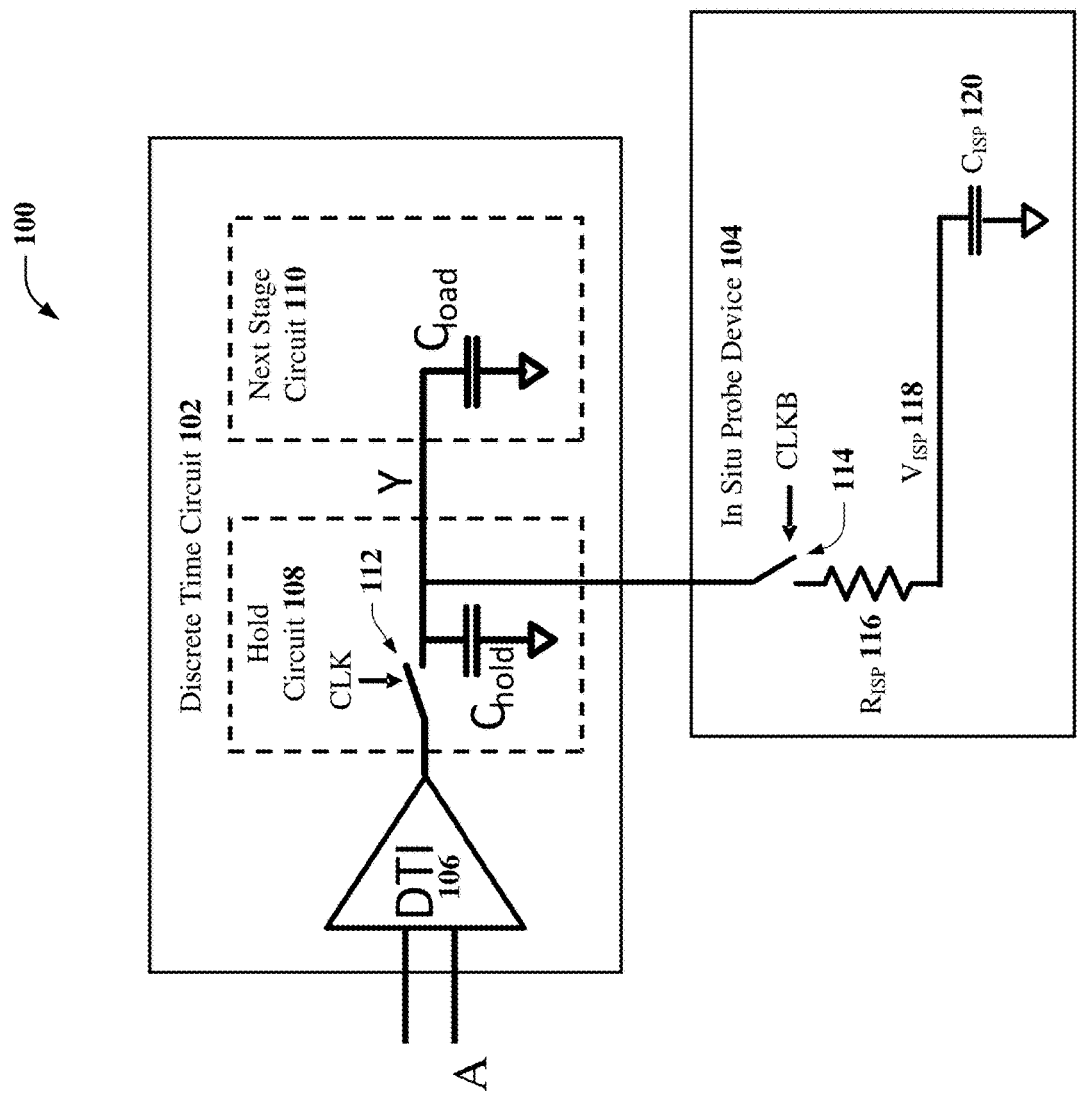
FIG. 1 illustrates a block diagram of an example, non-limiting device that can facilitate in situ probing of a discrete time circuit components in accordance with one or more embodiments described herein.

FIG. 1 illustrates a block diagram of an example, non-limiting device 100 that can facilitate in situ probing of a discrete time circuit components in accordance with one or more embodiments described herein. In some embodiments, device 100 can comprise a discrete time circuit 102 and/or an in situ probe device 104. In some embodiments, discrete time circuit 102 can comprise a discrete time integrator (DTI) 106, a hold circuit 108, and/or a next stage circuit 110. In some embodiments, discrete time integrator 106 can be coupled (e.g., electrically) to hold circuit 108. In some embodiments, hold circuit 108 can be coupled (e.g., electrically, communicatively, operatively, etc.) to next stage circuit 110. In some embodiments, in situ probe device 104 can be coupled (e.g., electrically, communicatively, operatively, etc.) to discrete time circuit 102. For example, in situ probe device 104 can be coupled (e.g., electrically, communicatively, operatively, etc.) to hold circuit 108.

According to multiple embodiments, the subject disclosure described herein and/or illustrated in the figures (e.g., device 100, device 300, device 400a, device 400b, device 400c, etc.) can constitute one or more components of an integrated circuit that can be fabricated in a semiconducting device. For example, the subject disclosure described herein and/or illustrated in the figures (e.g., device 100, device 300, device 400a, device 400b, device 400c, etc.) can constitute one or more components of an integrated circuit such as, for instance, a System on a Chip (SoC) device that can be fabricated in a complementary metal oxide semiconductor (CMOS) device.

In some embodiments, the subject disclosure described herein and/or illustrated in the figures (e.g., device 100, device 300, device 400a, device 400b, device 400c, etc.) can constitute one or more components of an integrated circuit that can be fabricated in a semiconducting device and implemented in a data communication device and/or a computing device. For example, the various embodiments of the subject disclosure described herein and/or illustrated in the figures (e.g., device 100, device 300, device 400a, device 400b, device 400c, etc.) can constitute one or more components of an integrated circuit (e.g., a SoC) that can be fabricated in a semiconducting device (e.g., a CMOS device) that can be implemented in a data communication device including, but not limited to, a wireline device, a wireline receiver, a wireline transmitter, a wireline transceiver, and/or another data communication device.

In some embodiments, fabrication of the various embodiments of the subject disclosure described herein and/or illustrated in the figures (e.g., device 100, device 300, device 400a, device 400b, device 400c, etc.) can comprise one or more multi-step sequences of, for example, photolithographic and/or chemical processing steps that can facilitate gradual creation of electronic-based systems, devices, components, and/or circuits in a semiconducting device (e.g., an integrated circuit such as, for instance, a SoC fabricated in a CMOS device). For example, the various embodiments of the subject disclosure described herein and/or illustrated in the figures (e.g., device 100, device 300, device 400a, device 400b, device 400c, etc.) can be fabricated by employing techniques including, but not limited to: photolithography, microlithography, nanolithography (e.g., a 7 nanometer (7 nm) lithography technology node), nanoimprint lithography, photomasking techniques, patterning techniques, photoresist techniques (e.g., positive-tone photoresist, negative-tone photoresist, hybrid-tone photoresist, etc.), etching techniques (e.g., reactive ion etching (RIE), dry etching, wet etching, ion beam etching, plasma etching, laser ablation, etc.), evaporation techniques, sputtering techniques, plasma ashing techniques, thermal treatments (e.g., rapid thermal anneal, furnace anneals, thermal oxidation, etc.), physical vapor deposition (PVD), chemical vapor deposition (CVD), atomic layer deposition (ALD), plasma enhanced chemical vapor deposition (PECVD), chemical solution deposition, electroplating, molecular beam epitaxy (MBE), electrochemical deposition (ECD), lift-off techniques, chemical-mechanical planarization (CMP), backgrinding techniques, and/or another technique for fabricating an integrated circuit.

In some embodiments, fabrication of the various embodiments of the subject disclosure described herein and/or illustrated in the figures (e.g., device 100, device 300, device 400a, device 400b, device 400c, etc.) can be performed using various materials. For example, the various embodiments of the subject disclosure described herein and/or illustrated in the figures (e.g., device 100, device 300, device 400a, device 400b, device 400c, etc.) can be fabricated using materials of one or more different material classes including, but not limited to: conductive materials, semiconducting materials, superconducting materials, dielectric materials, polymer materials, organic materials, inorganic materials, non-conductive materials, and/or another material that can be utilized with one or more of the techniques described above for fabricating an integrated circuit.

It should be appreciated that the embodiments of the subject disclosure depicted in various figures disclosed herein are for illustration only, and as such, the architecture of such embodiments are not limited to the systems, devices, and/or components depicted therein. For example, in some embodiments, the subject disclosure described herein and/or illustrated in the figures (e.g., device 100, device 300, device 400a, device 400b, device 400c, etc.) can further comprise various computer and/or computing-based elements. In some embodiments, such computer and/or computing-based elements can be used in connection with implementing one or more of the systems, devices, components, and/or operations shown and described in connection with FIG. 1 or other figures disclosed herein.

As referenced herein, components that can be "electrically" coupled can be coupled via electrical circuitry. For example, the terms "electrical circuitry," "electronic circuitry," "electric circuitry," "circuitry," and/or the like, utilized herein to describe components that can be "electrically" coupled can refer to coupling such components via one or more electronic components (e.g., resistors, transistors, capacitors, inductors, diodes, etc.) that are interconnected by conductive wires and/or traces through which electric current can flow (e.g., alternating current and/or direct current). As employed herein, the terms "electrical circuitry," "electronic circuitry," "electric circuitry," "circuitry," and/or the like, can describe one or more electric circuits that can facilitate various operations (e.g., transferring, storing, and/or altering electrical current, electrical signals, and/or electrical data) of the various embodiments of the subject disclosure described herein and/or illustrated in the figures (e.g., device 100, device 300, device 400a, device 400b, device 400c, etc.).

According to multiple embodiments, discrete time circuit 102 can comprise a discrete time analog circuit that can be used to perform signal conditioning. For example, discrete time circuit 102 can comprise a discrete time analog circuit that can be fabricated in a CMOS device and implemented in a wireline device (e.g., a wireline receiver, wireline transceiver, etc.), where such discrete time circuit 102 can be used to, for instance, amplify and/or equalize a signal (e.g., a data signal, a continuous time signal, etc.). In this example, to facilitate such signal conditioning, discrete time circuit 102 can manipulate one or more signal attributes of a signal. For instance, discrete time circuit 102 can manipulate one or more signal attributes (e.g., amplitude, power of low and/or high frequency components, etc.) of a signal (e.g., a data signal, a continuous time signal) received by such a wireline device.

In some embodiments, discrete time circuit 102 can comprise an analog circuit that can receive a continuous time and/or held signal at an input A of discrete time circuit 102. For example, discrete time circuit 102 can comprise a discrete time analog circuit that can operate synchronously based on a clock. In some embodiments, discrete time circuit 102 can comprise a discrete time analog circuit that can operate synchronously based on a clock by opening and/or closing a switch 112 based on a clock CLK depicted in FIG. 1. In such embodiments, clock CLK can comprise a clock signal generated by a clock generator (e.g., a crystal oscillator, an electronic oscillator, etc.), where such a clock signal can prompt opening and/or closing switch 112.

Figure 2:
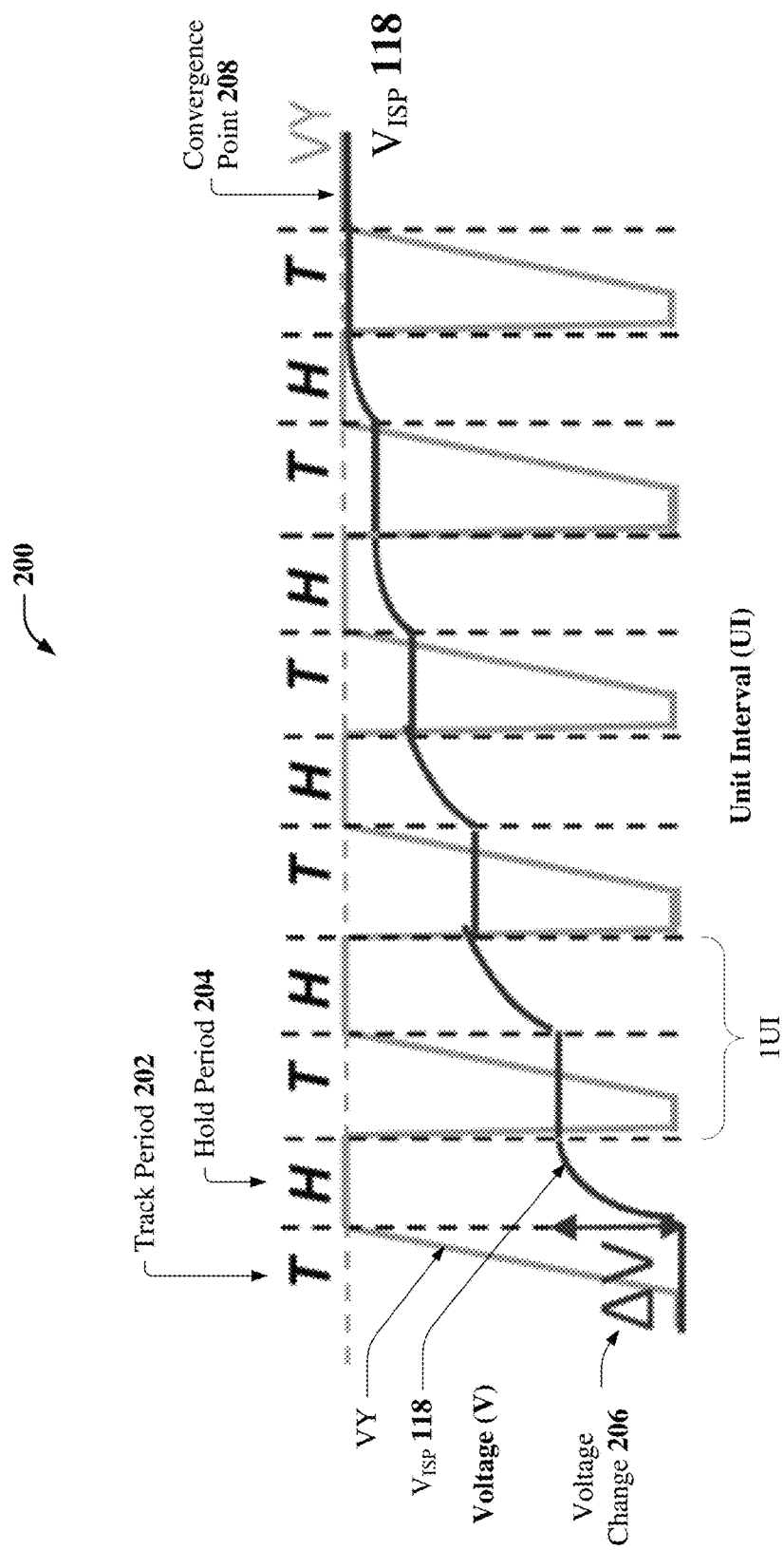
FIG. 2 illustrates an example, non-limiting timing diagram that can facilitate in situ probing of a discrete time circuit components in accordance with one or more embodiments described herein.

In some embodiments, based on receiving a continuous time signal at input A, discrete time circuit 102 can operate synchronously using clock CLK to prompt tracking and/or holding stages. For example, discrete time circuit 102 can use clock CLK to prompt a tracking stage (e.g., a track time, a track mode, a track period, etc.) by closing switch 112 for a certain interval of time, where such an interval of time can represent a multiple of a unit interval (UI) that can be based on the oscillating clock signal of clock CLK (e.g., 0.5 UI, 1 UI, 2 UI, etc.). In this example, discrete time circuit 102 can further utilize clock CLK to prompt a holding stage (e.g., a hold time, a hold mode, a hold period, etc.) by opening switch 112 for a certain interval of time (e.g., a multiple of a UI, for instance, 0.5 UI, 1 UI, 2 UI, etc.). In these examples, a time interval of 1 UI can comprise a track period and a hold period combined (e.g., 1 UI=T+H as depicted in FIG. 2).

In some embodiments, discrete time integrator 106 can comprise a discrete time integrator including, but not limited to, a peaked integrator, an integrating buffer, and/or another discrete time integrator. In some embodiments, hold circuit 108 can comprise a track and hold circuit.

In some embodiments, discrete time circuit 102 can employ discrete time integrator 106 and/or hold circuit 108 in such tracking and/or holding stages described above to execute tracking and/or holding functions associated with such a continuous time signal received at input A. For example, in a tracking stage, discrete time integrator 106 can build on node Y a signal (e.g., a sampled signal) that is an integrated version of a continuous time signal at input A, where the integrated signal can electrically charge capacitor $C_{hold}$ of hold circuit 108 in the tracking stage. In this example, at the end of the track period (e.g., at the beginning of a hold stage), discrete time circuit 102 can open switch 112 (e.g., via clock CLK) and hold circuit 108 can hold the integrated signal at node Y (e.g., the sampled signal) for the duration of a holding stage based on discharge of the electrical charge stored in capacitor $C_{hold}$ in the tracking stage. In some embodiments employing high sample rates (e.g., 25 to 50 Gsample/s), capacitor $C_{hold}$ can comprise a capacitor having a capacitance value ranging from approximately 10 femtofarads (fF) to approximately 50 fF. In some embodiments, the held signal at node Y can be sampled and/or used at another stage. For example, the held signal at node Y can be sampled and/or used at next stage circuit 110, which can comprise a capacitor $C_{load}$.

In some embodiments, discrete time circuit 102 can generate a sampled signal at a holding stage. For example, as described above, discrete time circuit 102 and/or discrete time integrator 106 can generate at node Y an integrated version of a continuous time signal received at input A. In this example, as described above, discrete time circuit 102 and/or hold circuit 108 can hold the integrated signal at node Y in a holding stage, where such a held signal at node Y can constitute the sampled signal. In some embodiments, discrete time circuit 102 and/or hold circuit 108 can hold the integrated signal constant for the duration of the hold period. For example, discrete time circuit 102 and/or hold circuit 108 can hold the integrated signal constant for a certain quantity of unit intervals (e.g., 0.5 UI, 1 UI, 2 UI, etc.), for instance, as illustrated in FIG. 2.

According to some embodiments, in situ probe device 104 can comprise one or more switches, one or more resistors, and/or one or more capacitors. For example, in situ probe device 104 can comprise one or more switches 114, one or more series resistors $R_{ISP}$ 116, and/or one or more capacitors $C_{ISP}$ 120 (e.g., as illustrated in FIG. 1). In some embodiments, such one or more series resistors $R_{ISP}$ 116 can comprise resistors having resistance values ranging from approximately 50 kiloohms (kΩ) to approximately 400 kΩ. In some embodiments, such one or more capacitors $C_{ISP}$ 120 can comprise capacitors having capacitance values ranging from approximately 20 fF to approximately 1,000 fF. In some embodiments, to limit charge sharing impact, capacitor $C_{ISP}$ 120 can be located after series resistor $R_{ISP}$ 116, for example, as illustrated in FIG. 1. In some embodiments, in situ probe device 104 can have minimum added load capacitance on node Y.

In some embodiments, in situ probe device 104 can be coupled (e.g., electrically) to discrete time circuit 102 and/or hold circuit 108. For example, in situ probe device 104 can be coupled to discrete time circuit 102 and/or hold circuit 108 via switch 114 that can open and/or close based on a clock CLKB depicted in FIG. 1. In such embodiments, clock CLKB can comprise a clock signal generated by a clock generator (e.g., a clock, a crystal oscillator, an electronic oscillator, etc.), where such a clock signal can prompt closing and/or opening switch 114, thereby coupling (e.g., electrically) and/or decoupling in situ probe device 104 to discrete time circuit 102 and/or hold circuit 108.

In some embodiments, clock CLKB can prompt opening and/or closing switch 114 based on a clock signal that can be different (e.g., inversed) from a clock signal of clock CLK that can prompt opening and/or closing switch 112. For example, clock CLKB of in situ probe device 104 can prompt opening switch 114 for the duration (e.g., 0.5 UI, 1 UI, 2 UI, etc.) of a tracking stage executed by discrete time circuit 102 as described above, where clock CLK can prompt closing switch 112 for such duration to facilitate such a tracking stage. Conversely, in this example, clock CLKB of in situ probe device 104 can further prompt (e.g., at clock CLKB=1) closing switch 114 for the duration (e.g., 0.5 UI, 1 UI, 2 UI, etc.) of a holding stage executed by discrete time circuit 102 as described above, where clock CLK can prompt opening switch 112 for such duration to facilitate such a holding stage. In this example, coupling (e.g., electrically) in situ probe device 104 to discrete time circuit 102 and/or hold circuit 108 by closing switch 114 in such a holding stage (e.g., at clock CLKB=1), can facilitate coupling (e.g., electrically connecting) the held signal at node Y to capacitor $C_{ISP}$ 120 through series resistor $R_{ISP}$ 116 (e.g., as illustrated in FIG. 1).

In some embodiments, in situ probe device 104 can measure one or more operating voltage values of discrete time circuit 102 at the holding stage based on a sampled signal. For example, in situ probe device 104 can be coupled to discrete time circuit 102 and/or hold circuit 108 in a holding stage executed by discrete time circuit 102 as described above. In this example, based on such coupling, in situ probe device 104 can measure one or more operating voltage values of the sampled signal generated at node Y in such a holding stage. In some embodiments, in situ probe device 104 can measure changes in a common mode value of a sampled signal based on a low-pass averaging filter.

In some embodiments, in situ probe device 104 can operate in one or more modes. For example, in situ probe device 104 can be used in a calibration mode (e.g., CM=1, CMB=0), where a constant differential input can be applied to in situ probe device 104 and both gain and common mode can be measured by in situ probe device 104 (e.g., as described here and below with reference to FIG. 4B). In another example, in situ probe device 104 can be used in a runtime mode (e.g., CM=0, CMB=1), where changes in common mode can be measured by in situ probe device 104 based on a time constant of ~$T=R_{ISP} \cdot C_{ISP}$ (e.g., as described below with reference to FIG. 4C).

In some embodiments, in situ probe device 104 can measure a constant gain value and/or a common mode value of a sampled signal based on a constant differential input applied to in situ probe device 104, thereby enabling a gain calibration. For example, to enable such a gain calibration (e.g., of discrete time circuit 102), in situ probe device 104 can be coupled to discrete time circuit 102 and/or hold circuit 108 in a holding stage executed by discrete time circuit 102 as described above, and a constant differential input (e.g., a voltage) can be applied to in situ probe device 104 while such device is coupled to discrete time circuit 102 and/or hold circuit 108. In this example, based on such coupling of in situ probe device 104 to discrete time circuit 102 and/or hold circuit 108 and such application of a constant differential input to in situ probe device 104, in situ probe device 104 can measure a constant gain value or a common mode value of the sampled signal generated at node Y in such a holding stage, which can be used to calibrate gain of, for example, discrete time circuit 102.

In some embodiments, the sampled signal generated at node Y in a holding stage executed by discrete time circuit 102 as described above can comprise a sampled signal of an actual data path. In these embodiments, in situ probe device 104 can be coupled to discrete time circuit 102 and/or hold circuit 108 in the holding stage executed by discrete time circuit 102 as described above and based on such coupling, in situ probe device 104 can measure a common mode value, a differential value, and/or a gain value of such sampled signal of an actual data path. In these embodiments, such measuring by in situ probe device 104 can facilitate a maintained defined operating point (e.g., target voltage Vtarget that can be maintained by implementing method 600 described below with reference to FIG. 6), reduced power consumption, and/or a reduced footprint associated with a device comprising in situ probe device 104 (e.g., device 100, a wireline receiver, a wireline transceiver, etc.) as compared with existing methods employing ex-situ calibration techniques such as replica bias circuits.

FIG. 2 illustrates an example, non-limiting timing diagram 200 that can facilitate in situ probing of a discrete time circuit component in accordance with one or more embodiments described herein. Repetitive description of like elements and/or processes employed in various embodiments described herein is omitted for sake of brevity.

According to multiple embodiments, timing diagram 200 can represent a timing diagram corresponding to implementation (e.g., operation) of device 100 described above with reference to FIG. 1. In some embodiments, timing diagram 200 can comprise one or more voltage values determined over one or more unit intervals (UI), where such unit intervals can represent time intervals (e.g., T+H as depicted in FIG. 2) corresponding to, for example, time period of a data transmission unit such as a channel symbol, in turn corresponding to clock signals of clock CLK and/or clock CLKB of device 100 described above with reference to FIG. 1. In some embodiments, timing diagram 200 can comprise average voltage values at node Y of discrete time circuit 102 (e.g., denoted VY in FIG. 2) over multiple track periods 202 and hold periods 204, as well as voltage values $V_{ISP}$ 118 on capacitor $C_{ISP}$ 120 of in situ probe device 104 over such track periods 202 and hold periods 204. In some embodiments, as described below and illustrated in FIG. 2, voltage value $V_{ISP}$ 118 can gradually increase during each hold period 204 by an amount that can be represented by voltage change 206 (e.g., denoted ΔV in FIG. 2). In these embodiments, such voltage change 206 can continue over multiple (e.g., 1,000) hold periods 204 until voltage value $V_{ISP}$ 118 converges with average voltage value VY at node Y during hold period at convergence point 208 (e.g., as described below).

In some embodiments, as described above with reference to FIG. 1, in situ probe device 104 can be coupled (e.g., electrically) to discrete time circuit 102 and/or hold circuit 108 in a hold period (e.g., via switch 114), which can enable coupling (e.g., electrically) node Y of discrete time circuit 102 to series resistor $R_{ISP}$ 116 and capacitor $C_{ISP}$ 120 of in situ probe device 104 (e.g., via switch 114). In such embodiments, over many (e.g., 1,000) cycles, voltage value $V_{ISP}$ 118 can gradually charge during each hold period 204 until voltage value $V_{ISP}$ 118 converges to average voltage value VY at convergence point 208 (e.g., as depicted in FIG. 2). In some embodiments, average voltage value VY can be determined only in each hold period 204 (e.g., as depicted in FIG. 2).

In some embodiments, to facilitate minimal intrusion on discrete time circuit 102, in situ probe device 104 can take an amount of charge (e.g., resulting in voltage change 206) from node Y during each hold period 204 that can be much smaller (e.g., 1,000 times smaller) than the voltage of discrete time circuit 102 (e.g., average voltage value VY) that in situ probe device 104 can measure (e.g., ΔV<<VY). In these embodiments, based on in situ probe device 104 taking such a small amount of charge (e.g., voltage change 206), the average value of voltage at node Y (e.g., average voltage value VY) can be determined over many cycles. In these embodiments, such minimal intrusion as described above, can thereby limit the affect in situ probe device 104 can have on data of average voltage value VY that can be used by next stage circuit 110 (e.g., data traveling through discrete time circuit 102). In these embodiments, to facilitate such minimal intrusion on discrete time circuit 102 (e.g., minimal intrusion on data of average voltage value VY), the time constant of the charge transfer from the Y node can be much longer (e.g., 1,000 times larger) than one sampling period (e.g., $R_{ISP} >> T_{clk}/C_{load}$ and $C_{ISP} >> C_{load}$).

Figure 3:
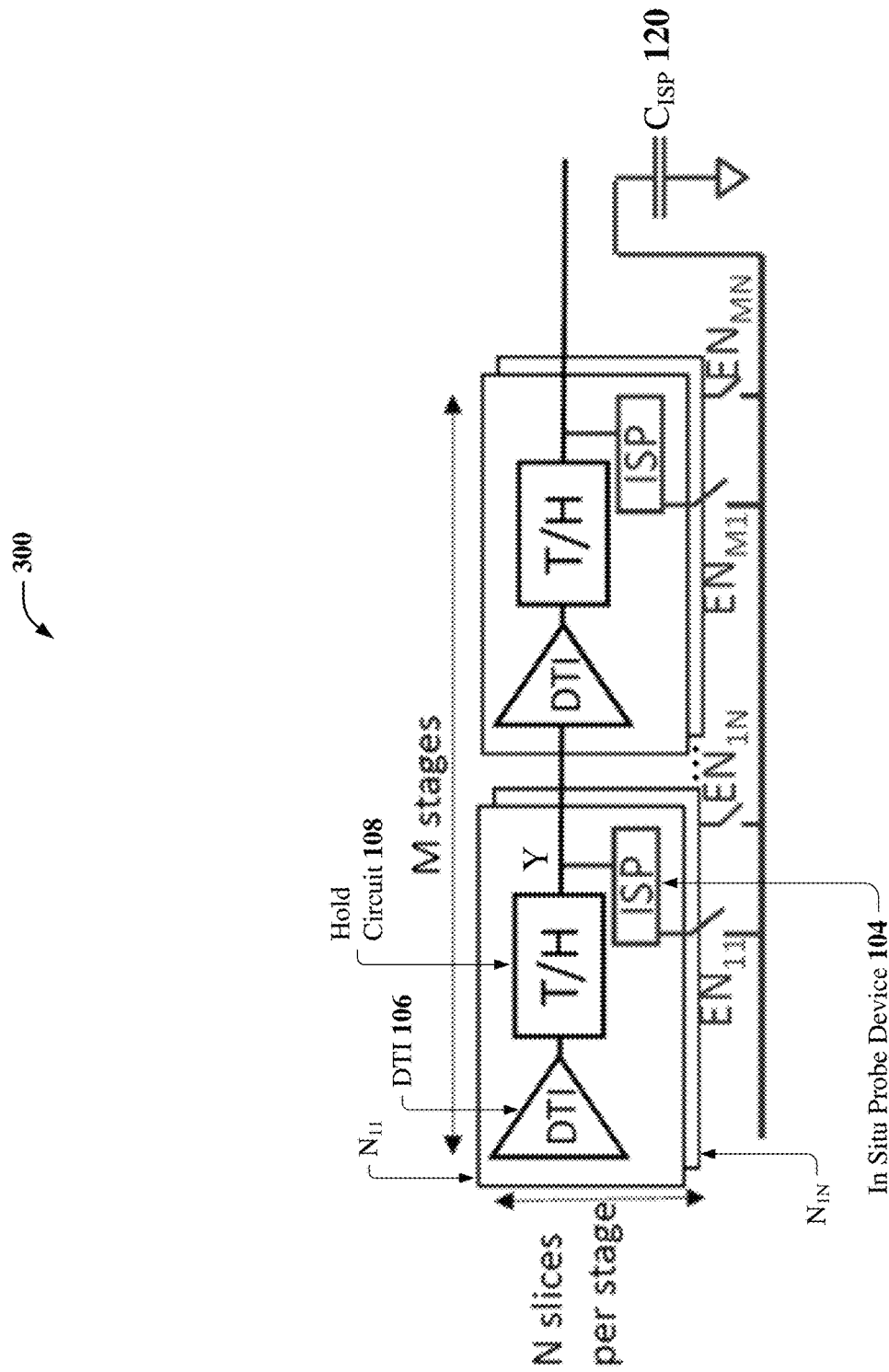
FIG. 3 illustrates a block diagram of an example, non-limiting device that can facilitate in situ probing of a discrete time circuit components in accordance with one or more embodiments described herein.

FIG. 3 illustrates a block diagram of an example, non-limiting device 300 that can facilitate in situ probing of a discrete time circuit components in accordance with one or more embodiments described herein. Repetitive description of like elements and/or processes employed in various embodiments described herein is omitted for sake of brevity.

According to multiple embodiments, device 300 can comprise an example, non-limiting alternative embodiment of device 100, where device 300 can comprise one or more in situ probe devices 104 coupled (e.g., electrically) to one or more discrete time circuits 102. In some embodiments, device 300 can comprise one or more in situ probe devices 104 coupled (e.g., electrically) to one or more discrete time circuits 102 based on a topology comprising M stages and/or N slices (e.g., devices such as, for instance, discrete time circuit 102) per stage of such components (e.g., as depicted in FIG. 3). In some embodiments, device 300 can comprise one or more switches $EN_{11}$, $EN_{1N}$, $EN_{M1}$, $EN_{MN}$ that can be coupled (e.g., electrically) to such one or more in situ probe devices 104 and/or capacitor $C_{ISP}$ 120.

In some embodiments, to facilitate probing a single node of a discrete time circuit 102 of device 300, in situ probe device 104 can be coupled (e.g., electrically) to such a discrete time circuit 102 and/or capacitor $C_{ISP}$ 120 by closing a single switch $EN_{11}$, $EN_{1N}$, $EN_{M1}$, $EN_{MN}$ that corresponds to such a discrete time circuit 102. For example, to facilitate probing node Y depicted in FIG. 2, in situ probe device 104 can be coupled (e.g., electrically) to discrete time circuit 102 and/or capacitor $C_{ISP}$ 120 by closing switch $EN_{11}$, where switches $EN_{1N}$, $EN_{M1}$, $EN_{MN}$ can remain open.

In some embodiments, to facilitate determining an average of a common mode across certain slices N of a certain stage M, certain in situ probe devices 104 corresponding to such certain slices N can be coupled to such certain slices N and/or capacitor $C_{ISP}$ 120 by closing certain switches $EN_{11}$, $EN_{1N}$, $EN_{M1}$, $EN_{MN}$ corresponding to such certain slices N. For example, to facilitate determining an average of a common mode across certain slices $N_{11}$ and $N_{1N}$, certain in situ probe devices 104 corresponding to slices $N_{11}$ and $N_{1N}$ can be coupled to $N_{11}$ and $N_{1N}$ and/or capacitor $C_{ISP}$ 120 by closing switches $EN_{11}$, $EN_{1N}$, where switches $EN_{M1}$, $EN_{MN}$ can remain open. In this example, such coupling one or more in situ probe devices 104 can facilitate a reduced footprint associated with device 300 and/or improved capacity of device 300 to obtain an average of multiple signals of interest coming from such one or more in situ probe devices 104 in a single measurement.

Figure 4A:
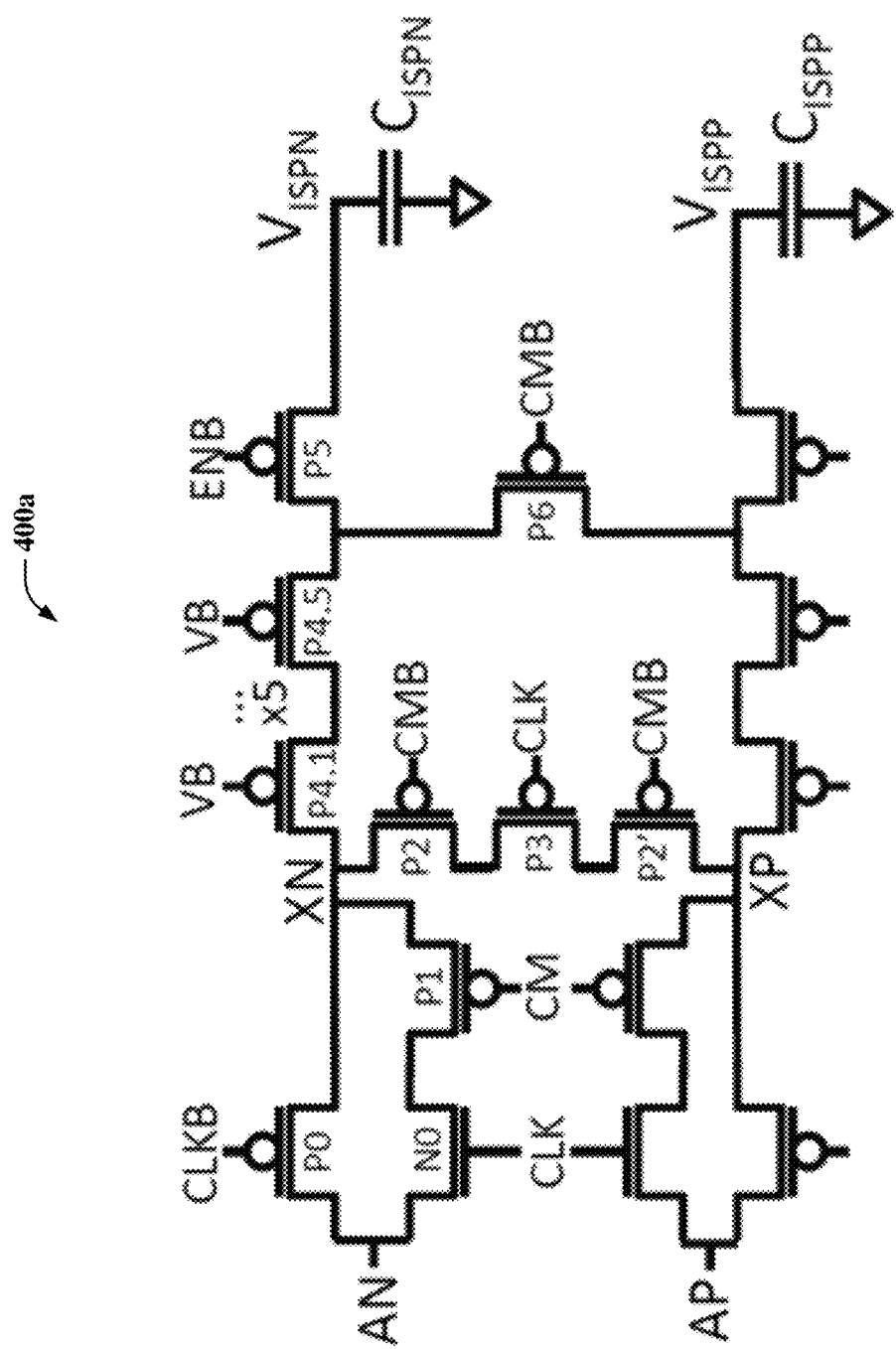
FIGS. 4A, 4B, 4C illustrate electrical schematics of example, non-limiting devices that can facilitate in situ probing of a discrete time circuit components in accordance with one or more embodiments described herein.

FIG. 4A illustrates an electrical schematic of an example, non-limiting device 400a that can facilitate in situ probing of a discrete time circuit components in accordance with one or more embodiments described herein. Repetitive description of like elements and/or processes employed in various embodiments described herein is omitted for sake of brevity.

According to multiple embodiments, device 400a can comprise an embodiment of in situ probe device 104, where FIG. 4A can comprise an example, non-limiting electrical schematic topology of such embodiment of in situ probe device 104. For example, device 400a can comprise an embodiment of in situ probe device 104 implemented in a complementary metal oxide semiconductor (CMOS) device, where FIG. 4A can comprise an example, non-limiting electrical schematic of such embodiment of in situ probe device 104.

In some embodiments, device 400a can depend on a signal CM and/or a signal CMB, which can comprise a complement of signal CM. In some embodiments, signal CM and/or signal CMB can comprise static signals. In some embodiments, device 400a can operate in one or more modes. For example, device 400a can operate in a calibration mode (e.g., CM=1, CMB=0) resulting in the equivalent circuit of device 400b and FIG. 4B. In another example device 400a can operate in a run-time mode (e.g., CM=0, CMB=1) resulting in the equivalent device 400c and FIG. 4C. In some embodiments, device 400b and/or device 400c can be employed by themselves rather than as part of device 400a to provide calibration and/or run-time functionality separately.

In some embodiments, device 400a and/or in situ probe device 104 can comprise certain electronic devices described below with reference to device 400b, device 400c, FIG. 4B, and FIG. 4C that can limit kickback and memory effects. For example, device 400a and/or in situ probe device 104 can comprise electronic devices including, but not limited to, active electronic devices, passive electronic devices, resistors, one or more pseudo resistors, switches, clocked switches, enable switches, capacitors, and/or another electronic device.

In some embodiments, nets AN and AP of in situ probe device 104 can be connected to node Y nets YN and YP of hold circuit 108. In some embodiments, the nets $V_{ISPx}$ can be shared by multiple in situ probe devices 104 and/or routed away to distant capacitors $C_{ISPx}$, which can facilitate reduced local area overhead associated with device 100, device 400a, discrete time circuit 102, and/or in situ probe device 104.

Figure 7A:
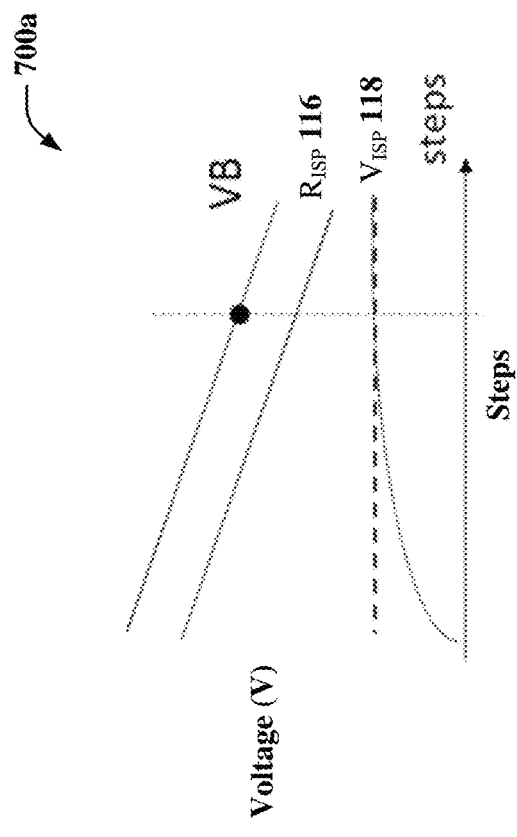
FIG. 7A illustrates an example, non-limiting diagram that can facilitate in situ probing of a discrete time circuit components in accordance with one or more embodiments described herein.
Figure 7B:
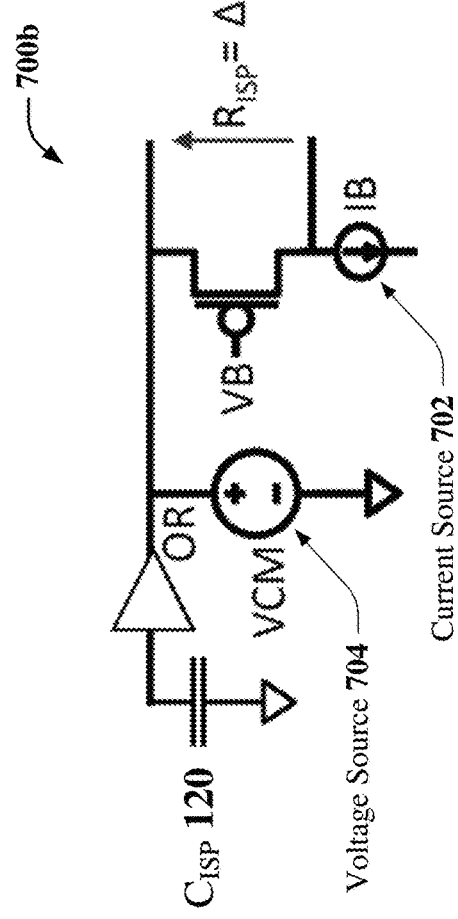
FIG. 7B illustrates an electrical schematic of an example, non-limiting device that can facilitate in situ probing of a discrete time circuit components in accordance with one or more embodiments described herein.
Figure 8:
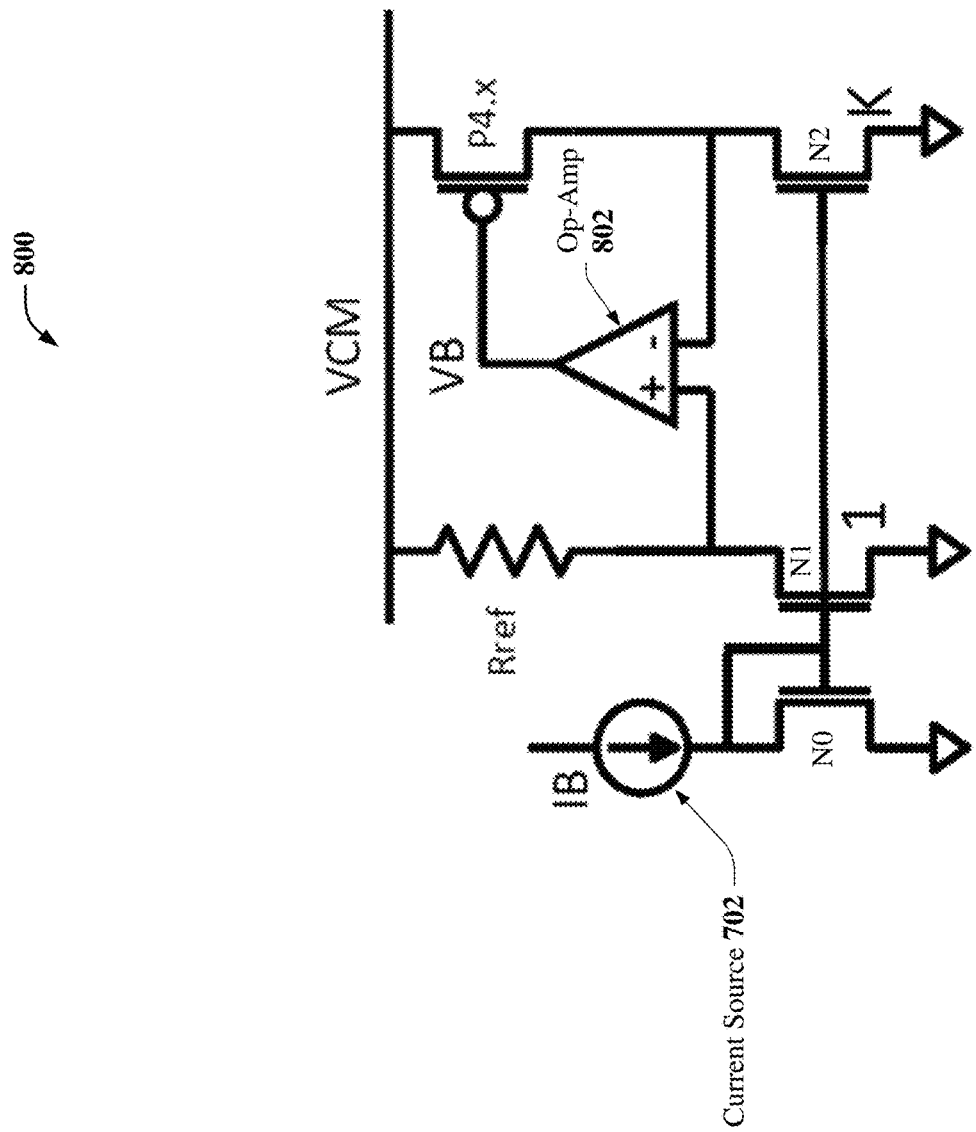
FIG. 8 illustrates an electrical schematic of an example, non-limiting device that can facilitate in situ probing of a discrete time circuit components in accordance with one or more embodiments described herein.

In some embodiments, device 400a can comprise a clocked switch P0, a resistive path or a pseudoresistor (e.g., denoted R4 in FIG. 4B) comprising resistance of switches P4.1, P4.2, P4.3, P4.4, P4.5 implemented as one or more (e.g., 5) series devices, and/or an enable switch P5. In some embodiments, switches N0, P0, P1, P2, P3 can comprise minimum voltage threshold devices (e.g., 200 millivolts (mV)). In some embodiments, switches P4.1, P4.2, P4.3, P4.4, P4.5, P5, P6 can comprise high voltage threshold devices (e.g., 500 mV). In some embodiments, switches N0, P0, P1, P2, P3, P4.1, P4.2, P4.3, P4.4, P4.5, P5, P6 can a minimum size. For example, switches N0, P0, P1, P2, P3, P4.1, P4.2, P4.3, P4.4, P4.5, P5, P6 can comprise 2 fins by 1 finger in a 7 nanometer (7 nm) lithography technology implemented in a CMOS device to achieve an approximate series of resistances having a certain value of resistance (e.g., 100 kilo Ohms (kΩ)). In some embodiments, bias voltage VB can be set to have switches P4.1, P4.2, P4.3, P4.4, P4.5 in linear regime providing a desired equivalent resistance R4=$R_{ISP}$ 116, where R4 can comprise switches P4.1, P4.2, P4.3, P4.4, P4.5. In some embodiments, bias voltage VB can be set in an open or closed loop fashion (e.g., as illustrated in FIGS. 7A, 7B, and 8).

In some embodiments, device 400a can facilitate dynamically maintaining calibration of the common mode as voltage, temperature, and/or other physical parameters drift. In some embodiments, device 400a can facilitate a gain calibration to set an absolute gain and/or aligning the gain of different parallel paths, for example, at start up.

Figure 4B:
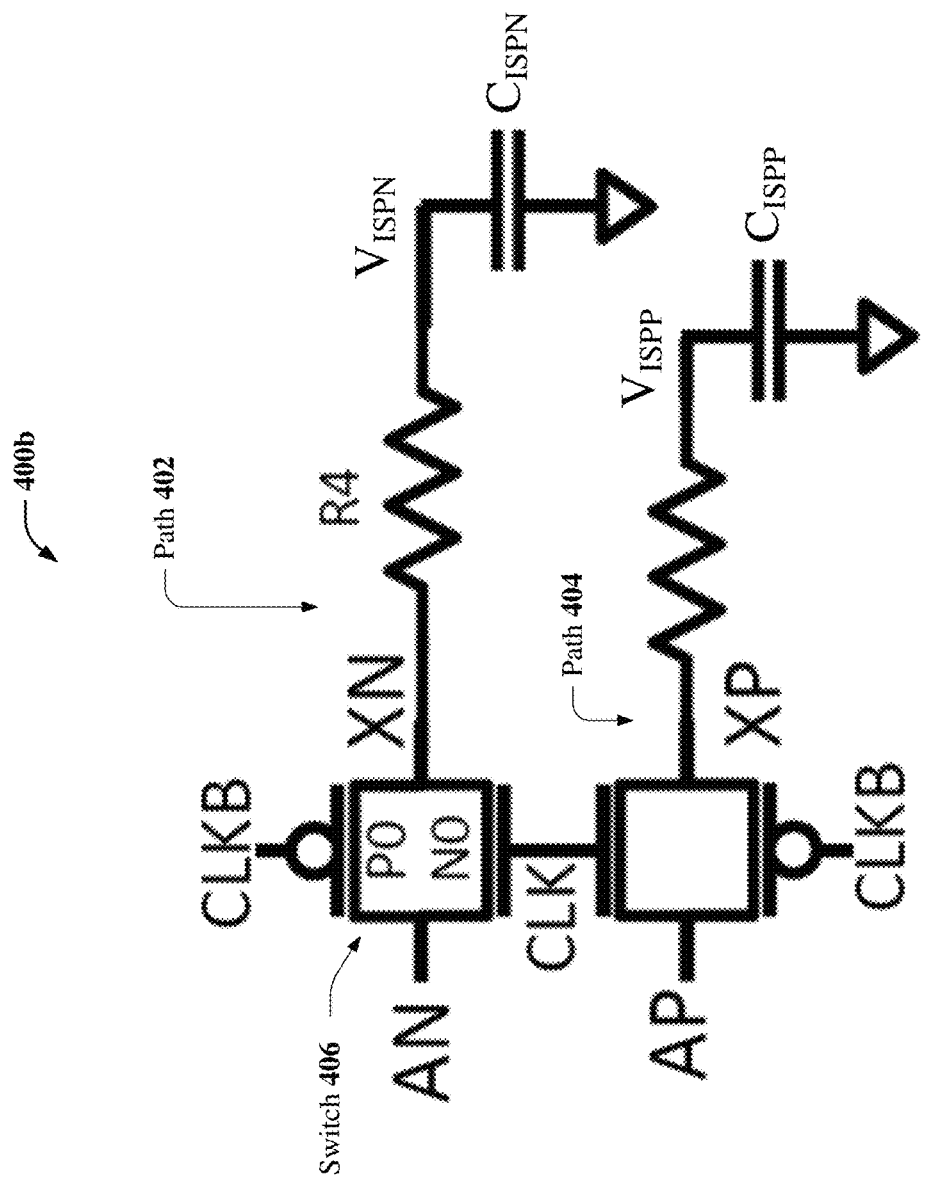

FIG. 4B illustrates an electrical schematic of an example, non-limiting device 400b that can facilitate in situ probing of a discrete time circuit components in accordance with one or more embodiments described herein. Repetitive description of like elements and/or processes employed in various embodiments described herein is omitted for sake of brevity.

According to multiple embodiments, device 400b can be a simplified view of device 400a, when device 400a is operating in calibration mode (e.g., CM=1, CMB=0). FIG. 4B can comprise an example, non-limiting equivalent circuit representing such an embodiment of device 400a operating in a calibration mode.

In some embodiments, to facilitate measuring differential voltage (e.g., at node Y of discrete time circuit 102), device 400b can comprise two (2) separate paths 402, 404. In these embodiments, path 402 can comprise switch 406, resistor R4, and/or capacitor $C_{ISPN}$, where such components can be coupled (e.g., electrically) to one another (e.g., via electrical circuitry as defined above). In some embodiments, switch 406 can comprise devices P0 and N0, which can operate as an open-close switch. In some embodiments, switch 406 can operate (e.g., open and/or close) based on a clock signal (e.g., an inverted clock signal) generated by clock signals CLK and CLKB. In some embodiments, resistor R4 can comprise an example, non-limiting embodiment of series resistor $R_{ISP}$ 116 of in situ probe device 104 described above with reference to FIG. 1. In some embodiments, resistor R4 can comprise an example, non-limiting embodiment of the pseudoresistor described above with reference to device 400a and FIG. 4A, which can comprise switches P4.1, P4.2, P4.3, P4.4, P4.5 implemented as one or more (e.g. 5) series devices. In some embodiments, for example, where in situ probe device 104 can be used in calibration mode, to avoid kickback on nets XN and XP, switch N0 can operate on the opposite clock phase (e.g., as illustrated in FIG. 4A).

In some embodiments, signals of path 402 and path 404 can be filtered through resistors of such respective paths (e.g., filtered through resistor R4 for path 402). In these embodiments, such signals can further charge capacitors of such respective paths (e.g., capacitor $C_{ISPN}$ for path 402), thereby facilitating measurement by in situ probe device 104 of differential voltage of, for example, discrete time circuit 102 and/or device 400b. In some embodiments, such measurement of differential voltage can be performed by applying a constant differential input (e.g., a constant DC differential input) to in situ probe device 104.

In some embodiments, due to load capacitance of nodes XN, XP, the measurement by in situ probe device 104 can be sensitive to kickback. In these embodiments, in measuring differential voltage, due to switches P0, N0, when clock signals of clock CLKB, CLK toggle, there is on average no charge injected on nodes XN, XP.

In some embodiments, however, node XN and/or node XP cannot be reset (e.g., cannot be cleared of previous signal voltage history) between each cycle (e.g., each track and hold cycle such as, track period 202 and hold period 204 described above with reference to FIG. 2), such nodes XN and/or XP can have intrinsic capacitance that can cause memory effects on, for example, discrete time circuit 102 and/or device 400b. Consequently, in such embodiments, device 400b cannot be utilized in run-time mode. In some embodiments, however, device 400c described below with reference to FIG. 4C can be utilized in run-time mode to measure a common mode value (e.g., a common mode value at node Y of discrete time circuit 102).

Figure 4C:
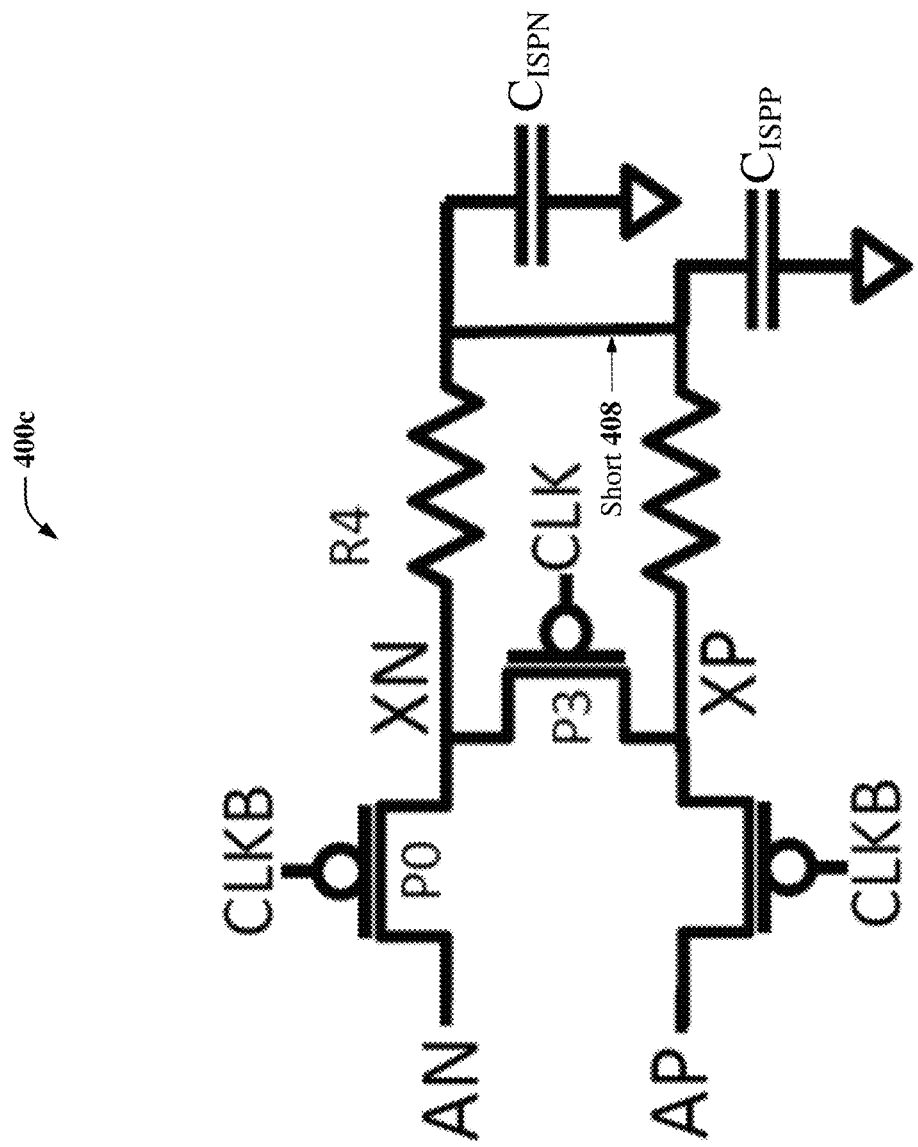

FIG. 4C illustrates an electrical schematic of an example, non-limiting device 400c that can facilitate in situ probing of a discrete time circuit components in accordance with one or more embodiments described herein. Repetitive description of like elements and/or processes employed in various embodiments described herein is omitted for sake of brevity.

According to multiple embodiments, device 400c can be a simplified view of device 400a, when device 400a is operating in run-time mode (e.g., CM=0, CMB=1). FIG. 4C can comprise an example, non-limiting equivalent circuit representing such an embodiment of device 400a operating in a calibration mode.

In some embodiments, for example, where in situ probe device 104 can be used in run-time mode, short 408 can facilitate measurement of common mode, average of nodes AN, AP. In some embodiments, for example, where in situ probe device 104 can be used in run-time mode, the differential value stored on XN and XP can be cleared (e.g., reset) between hold cycles, for instance, during track period 202. For example, such differential value can be cleared by clocked switch P3, which can provide anti-kickback and prevent memory effects, where switch N0 can be decoupled (e.g., electrically disconnected) by switch P1 of FIG. 4A. In these embodiments, if such differential value stored on XN and XP is not cleared, it can be injected back on the datapath Chou and cause inter-symbol interferences. In some embodiments, for example, where in situ probe device 104 can be used in run-time mode, only the common mode is measured, where nets $V_{ISPN}$ and $V_{ISPP}$ can optionally be coupled (e.g., electrically) by switch P6 of device 400a. In some embodiments, reset switch P3 can prevent clock injection on nodes XN, XP.

FIGS. 5A, 5B, and 5C illustrate example, non-limiting information 500a, 500b, 500c that can facilitate in situ probing of a discrete time circuit components in accordance with one or more embodiments described herein. Repetitive description of like elements and/or processes employed in various embodiments described herein is omitted for sake of brevity.

According to multiple embodiments, device 400a can be implemented in a CMOS device (e.g., via a 7 nm lithography technology process) and used to track the per-lane common mode and gain of a Peaked Integrator and Sampled Integrator (PI/SI) circuit of a receiver device (e.g., a wireline receiver device). In these embodiments, information 500a, 500b, 500c can represent information obtained from such an implementation.

In some embodiments, information 500a (FIG. 5A) can comprise differential voltage values and/or common mode values obtained from implementation of device 400a in a calibration mode (e.g., CM=1, CMB=0) and/or a run-time mode (e.g., CM=0, CMB=1), where such differential voltage values and/or common mode values can be based on a 20 millivolt (mV) input signal. In some embodiments, information 500a (FIG. 5A) can represent accuracy of the gain (e.g., 1.9 mV/7.6%) and/or the common mode (e.g., 8.7 mV/0.9 mV) measurements.

In some embodiments, the graph 500b (FIG. 5B) can comprise representations of: a 10 mV in step response at the PI output without in situ probe device 104 (e.g., denoted as 502 in FIG. 5B); with in situ probe device 104 in calibration mode (e.g., denoted as 504 in FIG. 5B); with in situ probe device 104 in run-time mode turned off (e.g., denoted as 506 in FIG. 5B); and turned on for a single lane and for all 4 lanes (e.g., 502, 504, and 506 overlapped as depicted in FIG. 5B). In some embodiments, the graph 500b can illustrate that the transient effect in the calibration mode can be expected because of memory effect on nodes XN and/or XP (e.g., as described above with reference to FIGS. 4A, 4B, and 4C) but it is not an issue as calibration can be performed with a differential input (e.g., a direct current (DC) differential input), only the settled value can affect the measurement. In some embodiments, the graph 500b can illustrate that gain loss penalty 508 can comprise a value of, for example, 0.2 decibels (dB) (e.g., as illustrated in FIG. 5B) and/or that there can be no asymmetry whether in situ probe device 104 is turned on or off.

In some embodiments, the chart 500c (FIG. 5C) can illustrate the estimated area of the circuits (e.g., based on number of fins×fingers), where in situ probe device 104 can occupy an area overhead of <5% of the circuitry required to realize the sampling functions. For example, as illustrated in FIG. 5C, in situ probe device 104 can occupy an area overhead of approximately 4.3%.

Figure 6:
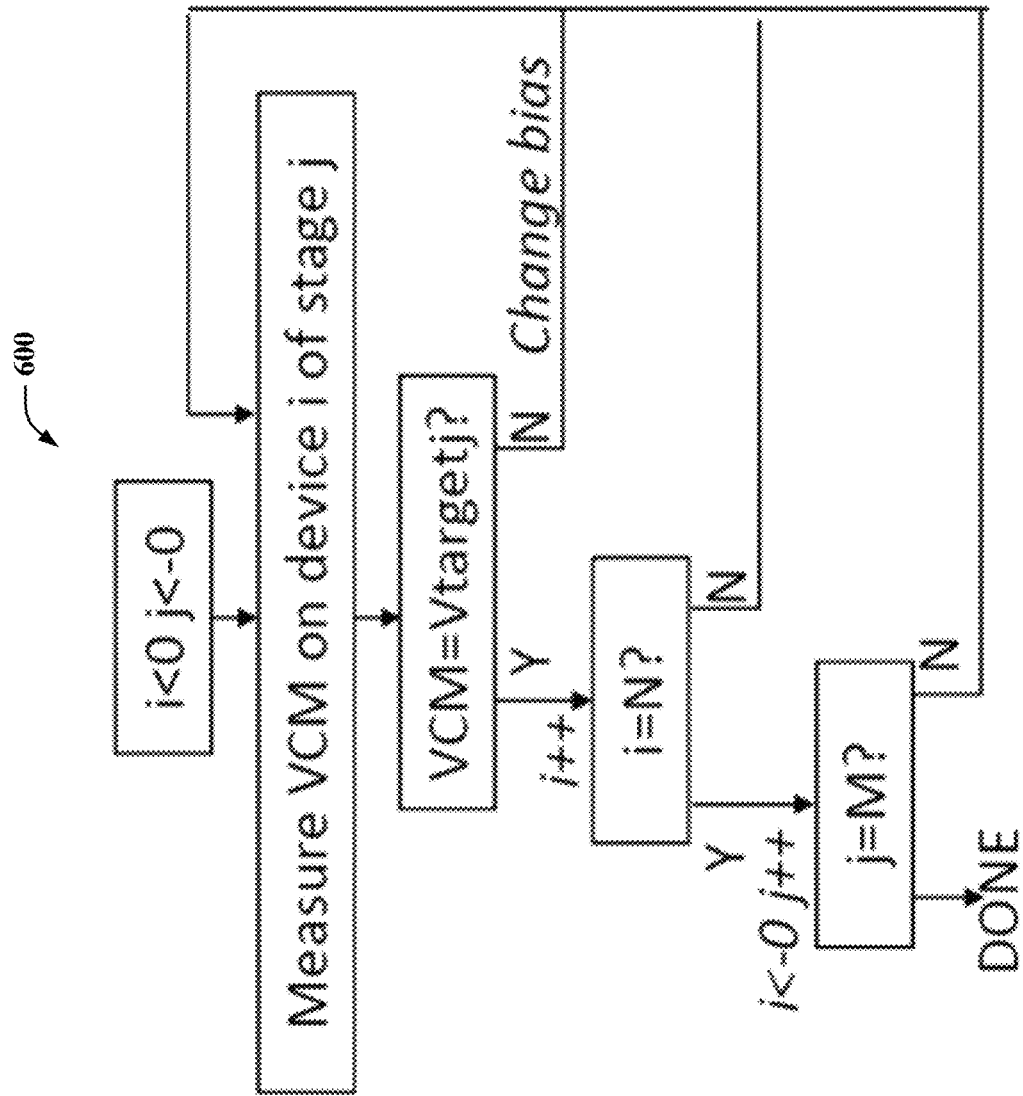
FIG. 6 illustrates a flow diagram of an example, non-limiting method that can facilitate in situ probing of a discrete time circuit components in accordance with one or more embodiments described herein.

FIG. 6 illustrates a flow diagram of an example, non-limiting method 600 that can facilitate in situ probing of a discrete time circuit components in accordance with one or more embodiments described herein. Repetitive description of like elements and/or processes employed in respective embodiments is omitted for sake of brevity.

In some embodiments, method 600 can be implemented to calibrate (e.g., via one or more in situ probe devices 104) the gain (e.g., startup gain calibration) of a multi-stage discrete time circuit (e.g., discrete time circuit 102) comprising N devices per stage of M stages. In some embodiments, method 600 can be implemented to calibrate (e.g., via one or more in situ probe devices 104) the common mode of a multi-stage discrete time circuit (e.g., discrete time circuit 102) comprising N devices per stage of M stages. In some embodiments, method 600 can be implemented (e.g., via one or more in situ probe devices 104) to iteratively measure the common mode (e.g., common mode voltage VCM as denoted in FIG. 6) of one or more N devices (e.g., denoted in FIG. 6 as device i) per stage of M stages (e.g., denoted in FIG. 6 as stage j) and/or adjusting the common mode (e.g., changing bias voltage as denoted in FIG. 6) such that it is within a defined voltage target range (e.g., denoted Vtargetj in FIG. 6). In these embodiments, such defined voltage target range can comprise a voltage target that can range from approximately 0 mV to approximately 1,000 mV in a CMOS device.

FIG. 7A illustrates an example, non-limiting diagram 700a that can facilitate in situ probing of a discrete time circuit components in accordance with one or more embodiments described herein. Repetitive description of like elements and/or processes employed in various embodiments described herein is omitted for sake of brevity.

In some embodiments, as described above with reference to FIG. 4A, bias voltage VB of device 400a, device 400b, and/or device 400c can be set in an open loop fashion. In some embodiments, bias voltage VB can be set in an open loop fashion by decreasing bias voltage VB until $V_{ISP}$ 118 reaches a stable value (e.g., as illustrated in FIG. 7A). In some embodiments, bias voltage VB can be set in an open loop fashion by using a replica circuit with a known current and bias voltage VB (e.g., as described below with reference to FIG. 7B).

FIG. 7B illustrates an electrical schematic of an example, non-limiting device 700b that can facilitate in situ probing of a discrete time circuit components in accordance with one or more embodiments described herein. Repetitive description of like elements and/or processes employed in various embodiments described herein is omitted for sake of brevity.

In some embodiments, bias voltage VB can be set in an open loop fashion by using a replica circuit (e.g., device 700b) with a known current IB where known current IB can be generated by a current source 702. In these embodiments, common mode voltage VCM can be obtained from a voltage source 704 or directly form a sampled voltage of the hold capacitor $C_{ISP}$ 120. The bias voltage VB is then adjusted in an open loop manner by obtaining (e.g., measuring) the voltage drop across the transistor ΔV and computing the effective resistance $R_{ISP}=\Delta V/IB$.

FIG. 8 illustrates an electrical schematic of an example, non-limiting device 800 that can facilitate in situ probing of a discrete time circuit components in accordance with one or more embodiments described herein. Repetitive description of like elements and/or processes employed in various embodiments described herein is omitted for sake of brevity.

In some embodiments, bias voltage VB can be set in a closed loop fashion by using a closed-loop controller that can generate the optimal bias voltage VB to match a replica P4.x (e.g., switches P4.1, P4.2, P4.3, P4.4, P4.5 as described above with reference to FIG. 4A) with a known high precision calibration resistor Rref. In these embodiments, common mode voltage VCM cab be generated in the same manner as described above with reference to device 700b and FIG. 7B. In these embodiments, area (e.g., footprint) of device 700b, device 400a, device 100, etc.) and power (e.g., used be device 700b, device 400a, device 100, etc.) can be reduced by changing the ratio K of the devices N1 and N2 forming the current mirror to K>1 in the mirror and Rref=$R_{ISP}$/K. In these embodiments, known current IB can be chosen such that the voltage drop IB·$R_{ISP}$ can be larger than the expected offset of an operational amplifier 802 (e.g., denoted Op-Amp 802 in FIG. 8).

In some embodiments, the subject disclosure (e.g., device 100, device 300, device 400a, device 400b, device 400c, etc.) can be a device, system, and/or process associated with various technologies. For example, the subject disclosure (e.g., device 100, device 300, device 400a, device 400b, device 400c, etc.) can be associated with wireline device technologies, wireline device calibration technologies, signal processing technologies, signal conditioning technologies, data communication device technologies, broadband device technologies, broadband signal technologies, discrete time circuit technologies, discrete time analog circuit technologies, signal sampling technologies, computing device technologies, computing hardware technologies, integrated circuit technologies, semiconductor device fabrication technologies, and/or other technologies.

In some embodiments, the subject disclosure (e.g., device 100, device 300, device 400a, device 400b, device 400c, etc.) can provide technical improvements to systems, devices, components, operational steps, and/or processing steps associated with the various technologies identified above. For example, the subject disclosure (e.g., device 100, device 300, device 400a, device 400b, device 400c, etc.) can eliminate the need of a full replica of a lane in a discrete time circuit to measure and/or calibrate one or more operating voltages of such a circuit. In this example, such a full replica of a lane in a discrete time circuit comes with an area and/or power overhead, requires careful matching of the probe circuit load, and/or cannot capture local mismatch between lanes, all of which can be eliminated by implementing one or more embodiments of the subject disclosure (e.g., in situ probe device 104, device 100, device 300, device 400a, device 400b, device 400c, etc.).

In some embodiments, the subject disclosure (e.g., device 100, device 300, device 400a, device 400b, device 400c, etc.) can provide technical improvements to a data communication device (e.g., a broadband device, a wireline receiver, a wireline transceiver, etc.). For example, as described above, the subject disclosure can eliminate the need of a full replica of a lane in a discrete time circuit, thereby facilitating reduced area (e.g., footprint) of such a circuit by reducing the number of components of the circuit, which can further reduce power consumed by the circuit. In this example, such a discrete time circuit not having a full replica of a lane can be implemented in a data communication device, thereby reducing an area (e.g., footprint) of such device and/or power consumed by such a device.

In some embodiments, the subject disclosure (e.g., device 100, device 300, device 400a, device 400b, device 400c, etc.) can employ hardware and/or software to solve problems that are highly technical in nature, that are not abstract and that cannot be performed as a set of mental acts by a human. In some embodiments, some of the processes described herein may be performed by one or more specialized data communication devices and/or computers for carrying out defined tasks related to in situ probing of a discrete time circuit. In some embodiments, the subject disclosure (e.g., device 100, device 300, device 400a, device 400b, device 400c, etc.) can be employed to solve new problems that arise through advancements in technologies mentioned above and/or another technology.

It is to be appreciated that the subject disclosure (e.g., device 100, device 300, device 400a, device 400b, device 400c, etc.) can perform an in situ probing of a discrete time circuit process utilizing various combinations of electrical components, mechanical components, and circuitry that cannot be replicated in the mind of a human or performed by a human. For instance, the amount of data processed, the speed of processing such data, and/or the types of data processed by the subject disclosure (e.g., device 100, device 300, device 400a, device 400b, device 400c, etc.) over a certain period of time can be greater, faster, and/or different than the amount, speed, and/or data type that can be processed by a human mind over the same period of time.

According to several embodiments, the subject disclosure (e.g., device 100, device 300, device 400*a*, device 400*b*, device 400*c*, etc.) can also be fully operational towards performing one or more other functions (e.g., fully powered on, fully executed, etc.) while also performing the above-referenced in situ probing of a discrete time circuit process. It should also be appreciated that the subject disclosure (e.g., device 100, device 300, device 400*a*, device 400*b*, device 400*c*, etc.) can include information that is impossible to obtain manually by an entity, such as a human user. For example, the type, amount, and/or variety of information included in device 100, discrete time circuit 102, in situ probe device 104, discrete time integrator 106, hold circuit 108, device 300, device 400*a*, device 400*b*, and/or device 400*c* can be more complex than information obtained manually by a human user.

Figure 9:
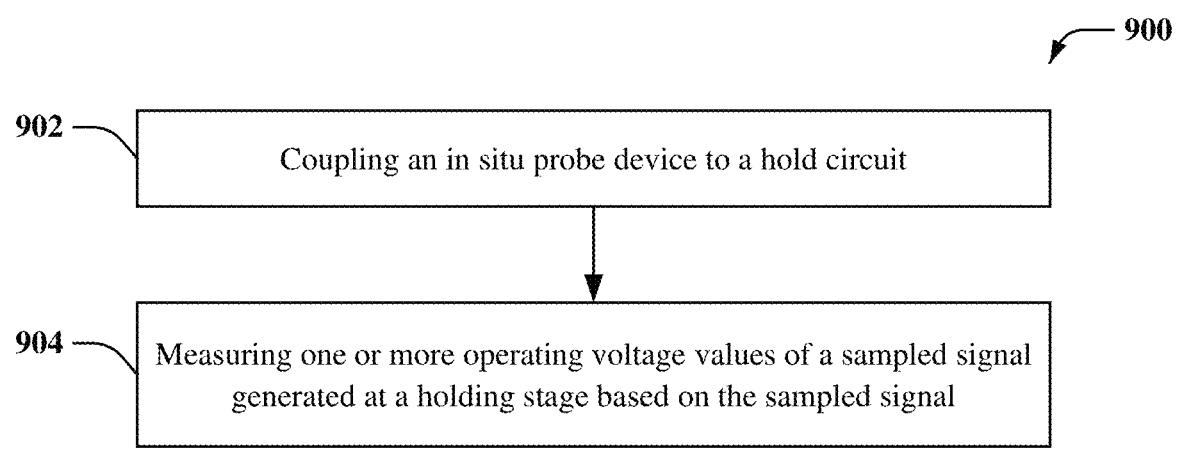
FIG. 9 illustrates a flow diagram of an example, non-limiting method that can facilitate in situ probing of a discrete time circuit components in accordance with one or more embodiments described herein.

FIG. 9 illustrates a flow diagram of an example, non-limiting method 900 that can facilitate in situ probing of a discrete time circuit components in accordance with one or more embodiments described herein. Repetitive description of like elements and/or processes employed in respective embodiments is omitted for sake of brevity.

At 902, coupling (e.g., via device 100 and/or in situ probe device 104) an in situ probe device (e.g., in situ probe device 104) to a hold circuit (e.g., hold circuit 108). At 904, measuring (e.g., via in situ probe device 104) one or more operating voltage values (e.g., gain, differential voltage, common mode, etc.) of a sampled signal (e.g., an integrated signal generated by discrete time integrator 106) generated at a holding stage (e.g., hold period 204 described above with reference to FIG. 2) based on the sampled signal.

Figure 10:
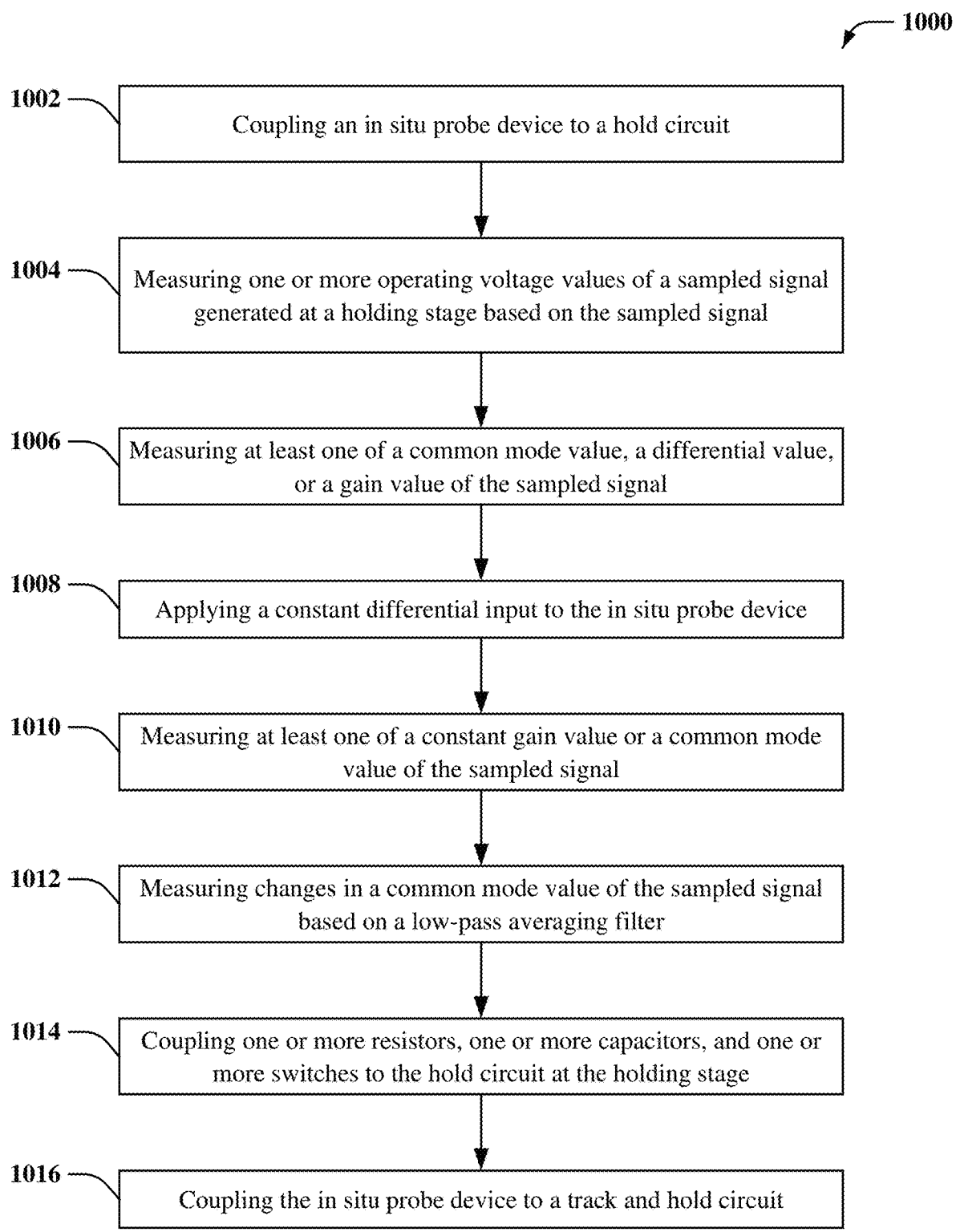
FIG. 10 illustrates a flow diagram of an example, non-limiting method that can facilitate in situ probing of a discrete time circuit components in accordance with one or more embodiments described herein.

FIG. 10 illustrates a flow diagram of an example, non-limiting method 1000 that can facilitate in situ probing of a discrete time circuit components in accordance with one or more embodiments described herein. Repetitive description of like elements and/or processes employed in respective embodiments is omitted for sake of brevity.

At 1002, coupling (e.g., via device 100 and/or in situ probe device 104) an in situ probe device (e.g., in situ probe device 104) to a hold circuit (e.g., hold circuit 108). At 1004, measuring (e.g., via in situ probe device 104) one or more operating voltage values (e.g., gain, differential voltage, common mode, etc.) of a sampled signal (e.g., an integrated signal generated by discrete time integrator 106) generated at a holding stage (e.g., hold period 204 described above with reference to FIG. 2) based on the sampled signal. At 1006, measuring (e.g., via in situ probe device 104) at least one of a common mode value, a differential value, and/or a gain value of the sampled signal. At 1008, applying (e.g., via a voltage and/or current source) a constant differential input to the in situ probe device. At 1010, measuring (e.g., via in situ probe device 104) at least one of a constant gain value and/or a common mode value of the sampled signal. At 1012, measuring (e.g., via in situ probe device 104) changes in a common mode value of the sampled signal based on a low-pass averaging filter. At 1014, coupling (e.g., via in situ probe device 104) one or more resistors, one or more capacitors, and/or one or more switches to the hold circuit at the holding stage. At 1016, coupling (e.g., via in situ probe device 104) the in situ probe device to a track and hold circuit.

For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the methodologies in accordance with the disclosed subject matter. In addition, those skilled in the art will understand and appreciate that the methodologies could alternatively be represented as a series of interrelated states via a state diagram or events.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
   a hold circuit that generates a sampled signal at a holding stage; and
   an in situ probe device coupled to the hold circuit that measures one or more operating voltage values at the holding stage based on the sampled signal.

2. The device of claim 1, wherein the sampled signal comprises a sampled signal of an actual data path, and wherein the in situ probe device measures at least one of a common mode value, a differential value, or a gain value of the sampled signal of the actual data path, thereby facilitating a defined operating point of the hold circuit, while maintaining low power consumption and area of the device.

3. The device of claim 1, wherein the in situ probe device measures at least one of a constant gain value or a common mode value of the sampled signal based on a constant differential input applied to the in situ probe device to enable a gain calibration.

4. The device of claim 1, wherein the in situ probe device comprises one or more resistors, one or more capacitors, and one or more switches coupled to the hold circuit at the holding stage.

5. The device of claim 1, wherein the in situ probe device comprises electronic devices coupled to the hold circuit at the holding stage to facilitate at least one of kickback prevention or memory effects prevention, and wherein the electronic devices are selected from a group consisting of active electronic devices, passive electronic devices, resistors, one or more pseudo resistors, switches, clocked switches, enable switches, and capacitors.

6. The device of claim 1, wherein the hold circuit comprises a track and hold circuit.

7. The device of claim 1, wherein at least one of the hold circuit or the in situ probe device is implemented in a complementary metal oxide semiconductor device.

8. A method, comprising:
coupling an in situ probe device to a hold circuit; and
measuring one or more operating voltage values of a sampled signal generated at a holding stage based on the sampled signal.

9. The method of claim 8, wherein the measuring comprises, measuring at least one of a common mode value, a differential value, or a gain value of the sampled signal.

10. The method of claim 8, further comprising:
applying a constant differential input to the in situ probe device; and
measuring at least one of a constant gain value or a common mode value of the sampled signal.

11. The method of claim 8, wherein the measuring comprises, measuring changes in a common mode value of the sampled signal based on a low-pass averaging filter.

12. The method of claim 8, wherein the coupling comprises, coupling one or more resistors, one or more capacitors, and one or more switches to the hold circuit at the holding stage.

13. The method of claim 8, wherein the coupling comprises, coupling the in situ probe device to a track and hold circuit.

14. A device, comprising:
a wireline device comprising a discrete time circuit that generates a sampled signal at a holding stage; and
one or more in situ probe devices coupled to the discrete time circuit that measure one or more operating voltage values at the holding stage based on the sampled signal.

15. The device of claim 14, wherein the one or more in situ probe devices measure at least one of a common mode value, a differential value, or a gain value of the sampled signal, thereby facilitating maintenance of an optimal operating point while providing a reduction of power consumption associated with this maintenance process.

16. The device of claim 14, wherein the one or more in situ probe devices measure at least one of a constant gain value or a common mode value of the sampled signal in one or more points of the device based on a constant differential input applied to an input of the device.

17. The device of claim 14, wherein the one or more in situ probe devices measure changes in a common mode value of the sampled signal or sampled signals based on a low-pass averaging filter.

18. The device of claim 14, wherein the wireline device is selected from a group consisting of a wireline receiver and a wireline transceiver.

19. The device of claim 14, wherein the discrete time circuit comprises a discrete time analog circuit that manipulates one or more signal attributes of a signal received by the wireline device.

20. The device of claim 14, comprising two or more in situ probe devices where two or more of the probe devices are coupled to a capacitor, thereby facilitating at least one of a reduced footprint associated with the device or improved capacity of the device to obtain an average of multiple signals of interest coming from the one or more in situ probe devices in a single measurement.

* * * * *